United States Patent
Chung et al.

(10) Patent No.: US 7,821,041 B2
(45) Date of Patent: Oct. 26, 2010

(54) ELECTRICAL FUSE CIRCUIT FOR SECURITY APPLICATIONS

(75) Inventors: Shine Chung, Taipei Hsien (TW); Fu-Lung Hsueh, Hsinchu (TW); Fu-Chieh Hsu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 751 days.

(21) Appl. No.: 11/748,959

(22) Filed: May 15, 2007

(65) Prior Publication Data

US 2008/0283963 A1 Nov. 20, 2008

(51) Int. Cl.
*H01L 29/73* (2006.01)

(52) U.S. Cl. ............... 257/209; 257/529; 257/E29.001

(58) Field of Classification Search .......... 257/209, 257/529, E29.001
See application file for complete search history.

(56) References Cited

U.S. PATENT DOCUMENTS 6,330,204 B1 * 12/2001 Miyagi .............. 365/225.7
2002/0075062 A1 * 6/2002 Kitade .................. 327/530
2005/0052892 A1 * 3/2005 Low et al. ............... 365/94

OTHER PUBLICATIONS

Alavi, Mohsen et al., "A PROM Element Based on Salicide Agglomeration of Poly Fuses in a CMOS Logic Process", IEEE IEDM, pp. 855-858 (1997).
Kalnitsky, Alexander et al., "$CoSi_2$ integrated fuses on poly silicon for low voltage 0.18 μm CMOS applications", IEEE IEDM, pp. 765-768 (1999).
Kothandaraman, C., et al. "Electrically Programmable Fuse (eFUSE) Using Electromigration in Silicides", IEEE Electron Device Letters, vol. 23, No. 9, pp. 523-525 (Sep. 2002).

* cited by examiner

*Primary Examiner*—Thanh V Pham
(74) *Attorney, Agent, or Firm*—K&L Gates LLP

(57) ABSTRACT

A fuse circuit is disclosed, which comprises at least one electrical fuse element having a resistance that changes after being stressed in an electromigration mode, a switching device serially coupled with the electrical fuse element in a predetermined path between a fuse programming power supply (VDDQ) and a low voltage power supply (GND) for selectively allowing a programming current passing through the electrical fuse element during a programming operation, and at least one peripheral circuit coupled to the VDDQ, wherein the peripheral circuit is active and draws current from the VDDQ during a fuse programming operation.

15 Claims, 6 Drawing Sheets

ELECTRICAL FUSE CIRCUIT FOR SECURITY APPLICATIONS

BACKGROUND

The present invention relates generally to electrical fuse circuit designs, and more particularly to designing a tamper-resistant electrical fuse circuit for security applications.

Electrical fuse is a convenient logic nonvolatile memory for permanently holding information such as "chip-ID", etc. A typical implementation is a laser-fuse, where laser energy is used to program the fuse by evaporating metal or polysilicon links and the resulting resistance change is sensed using a latch. However pitches of the laser-fuse device are not scalable below the wavelength of the laser beam, typically 1.06 um, thus the laser-fuse is not suitable for deep submicron technologies.

To overcome the laser-fuse's pitch limitation, an electrical fuse, typically made of silicided polysilicon, uses electrical current instead to program. When programming the electrical fuse, a high current density, typically 600 mA/um$^2$ for the silicided polysilicon, is applied to the electrical fuse link for a certain period of time. The resistance of the electrical fuse will rise due to the electrical stress in its fuse link. A few micro seconds of stress may be a long enough time to cause a discernable resistance change, ideally more than 1 Kohm, in the electrical fuse.

FIG. 1 is a schematic diagram illustrating a conventional electrical fuse circuit 100, which comprises a programming block 110 and a sensing block 120. The programming block 110 is implemented as a PMOS transistor 113 coupled between an electrical fuse element 122 and a programming power supply VDDQ. When a gate signal SL of the PMOS transistor 113 is turned low, this particular electrical fuse element 122 is selected for being programmed, i.e., a programming current will flow through it. After being subject to the programming current for a certain period of time, the resistance of the electrical fuse element 122 will rise. The sensing block 120 which comprises a reference resistor 124, PMOS transistors 132 and 136 and NMOS transistors 134 and 138, is to sense the resistance level of the electrical fuse element 122. The sensing block 120 then outputs a logic state at a node Q through an inverter 142. A logic LOW at node Q may correspond to a programmed electrical fuse element 122, i.e., electromigration stressed. On the other hand, a logic HIGH at node Q corresponds to a not-programmed electrical fuse element 122.

However this conventional electrical fuse circuit 100 has limitations. First, the current that is used to stress the conventional electrical fuse 122 is normally quite high and may cause visible changes, such as cracks, in the fuse link. Therefore, data stored in the electrical fuse circuit 100 can be detected through visual inspections which render it unfit for security applications, such as smart cards and micro code storage.

Second, when the PMOS transistor 113 is turned on and a relatively small VDDQ voltage, for instance 300 mV, is applied, the electrical fuse element 122 will not be stressed enough to cause its resistance to rise. But in the conventional fuse circuit 100, since the VDDQ voltage supplies only to the electrical fuse element 122, the resistance value (R) of the electrical fuse element 122 can be read out by measuring a current (I) that flows through the electrical fuse element 122, and calculating R=VDDQ/I, presumably the gate of MOS 132 is turned off. Therefore, data stored in the conventional electrical fuse circuit 100 can also be read out electrically through an externally accessible programming channel without altering the data. For this reason the conventional electrical fuse circuit 100 cannot be used for security applications either.

Third, the conventional sensing block 120 may not be sensitive enough in low voltages to distinguish the small resistance change in the electrical fuse element 122 caused by the electromigration. Referring to FIG. 1, the NMOS transistor 134 is biased into saturation region by the NMOS transistor 138. This bias voltage is determined by a voltage divider formed by the PMOS transistor 136, the NMOS transistor 138 and the reference resistor 124. A resistance variation of the electrical fuse element 122 changes the source voltage of the NMOS transistor 134 which causes a current flowing through the PMOS transistor 132 to vary. In this configuration, the PMOS transistor 132 operates in a low impedance state of linear region. If so, the gain of the sensing block 120 is low, and the sensing block may not be sensitive enough to detect small resistance change in the electrical fuse element 122, thereby failing its function.

As such, what is desired is an electrical fuse circuit that can be programmed electrically, yet data stored therein cannot be optically observed or electrically read out by unauthorized means.

SUMMARY

In view of the foregoing, the present invention provides a fuse circuit in an integrated circuit (IC) which comprises at least one electrical fuse element having a resistance that changes after being stressed in an electromigration mode, a switching device serially coupled with the electrical fuse element in a predetermined path between a fuse programming power supply (VDDQ) and a low voltage power supply (GND) for selectively allowing a programming current passing through the electrical fuse element during a programming operation, and at least one peripheral circuit coupled to the VDDQ, wherein the peripheral circuit is active and draws current from the VDDQ during a fuse programming operation.

According to another aspect of the present invention, one or more metal layers are used to substantially cover the electrical fuse elements for preventing optical observation thereof.

According to yet another aspect of the present invention, a method is provided for programming a secured electrical fuse circuit, which comprises providing a programming power supply to an array of electrical fuse elements at a voltage only to cause electromigration in the electrical fuse elements, selectively coupling the programming voltage power supply to at least one electrical fuse element for programming the same through a control of at least one switching device, and supplying current from the programming voltage power supply to at least one peripheral circuit while programming the electrical fuse element.

The construction and method of operation of the invention, however, together with additional objects and advantages thereof will be best understood from the following description of specific embodiments when read in connection with the accompanying drawings.

DESCRIPTION

The following will provide a detailed description of a system and method for constructing a secure, tamper-resistant electrical fuse circuit, which uses electromigration as a stress mode for creating resistance change after programming.

The electrical stress on a silicided polysilicon fuse may have different modes. When the stress current density is higher than a certain level, typically 600 mA/um$^2$, the stress mode becomes either agglomeration or rupture. The agglomeration refers to a silicide decomposition. The rupture refers to a broken polysilicon due to thermal expansion. On the other hand, when the stress current density is lower than the typical 600 mA/um$^2$ level, the stress mode may be an electromigration. The electromigration is a mass transport of a metal due to the momentum transfer between conducting electrons and diffusing metal atoms. As a result of the electromigration, tiny voids may be created in the silicide which increases the resistance thereof. Over time the tiny voids may accumulate into a large void. Under a modest stress, in terms of stress current density and stress time, the tiny voids may not be large enough to create a visible change in the fuse, yet, the resistance rise may already be large enough, such as about 300 ohm, to be detected. The present invention utilizes such modest stress to program the electrical fuse without altering its appearance.

Figure 1:
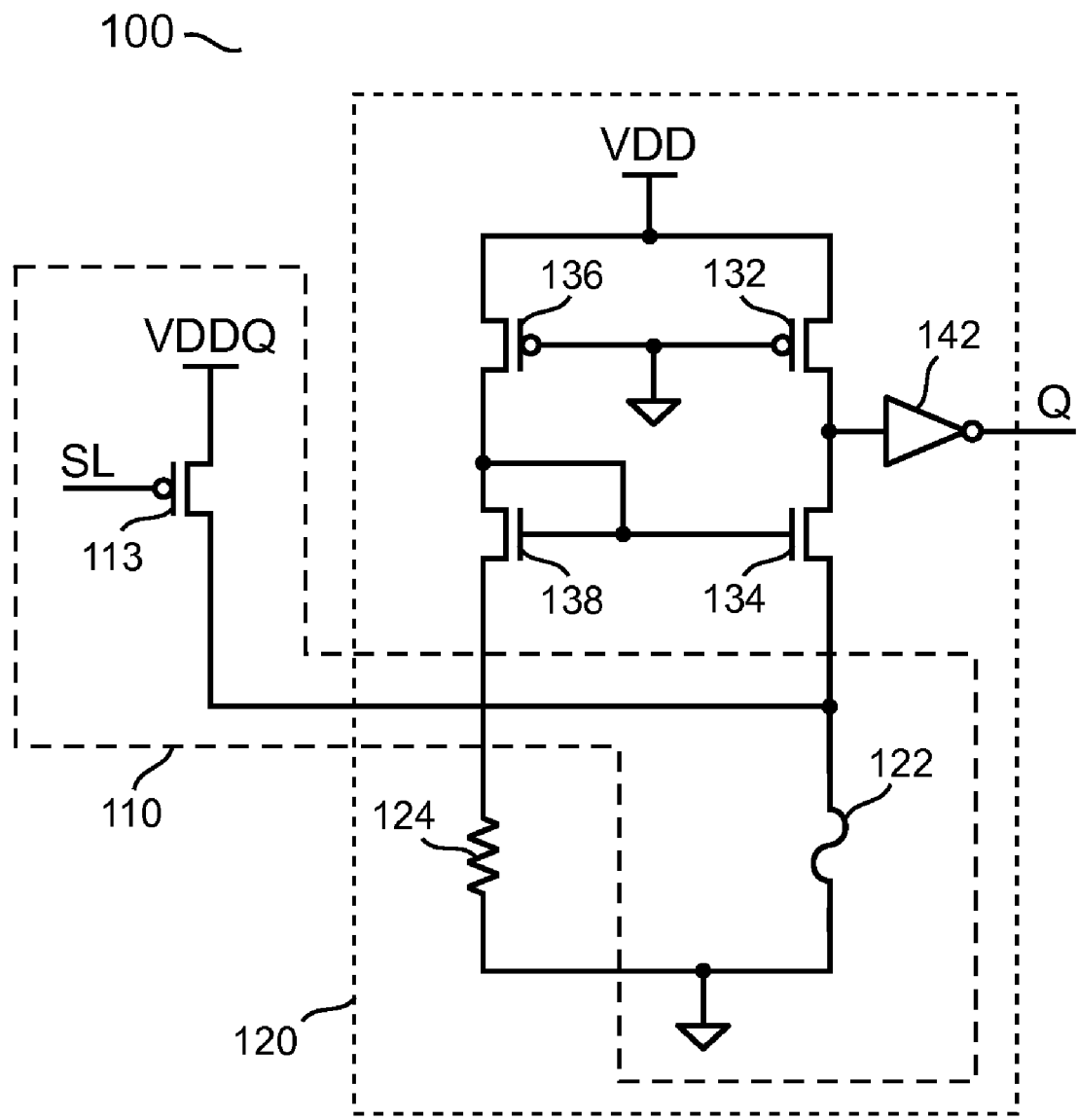
FIG. 1 is a schematic diagram illustrating a conventional electrical fuse circuit.
Figure 2:
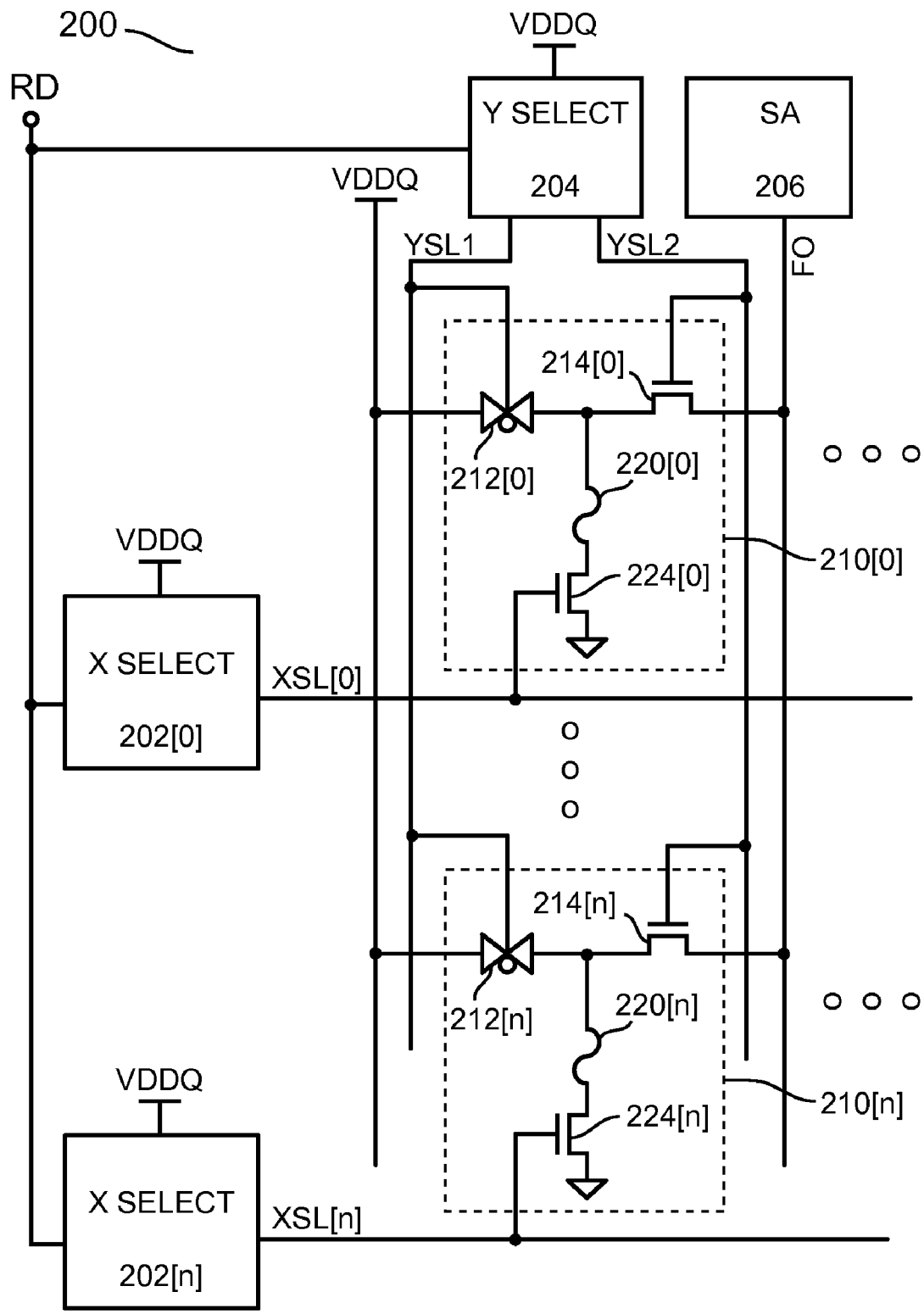
FIG. 2 is a schematic diagram illustrating an electrical fuse circuit with an array of fuse cells and corresponding control circuits according to an embodiment of the present invention.

FIG. 2 is a schematic diagram illustrating an electrical fuse circuit 200 with an array of fuse cells 210[0:n] and corresponding control circuits 202[0:n], 204 and 206, according to an embodiment of the present invention. All the fuse cells 210[0:n] are structured identically. As an example, the fuse cell 210[0] comprises an electrical fuse element 220[0], a switching NMOS transistor 224[0], a transmission gate 212[0] and a transmission NMOS transistor 214[0]. The electrical fuse element 220[0] is made of silicided polysilicon with a resistance that may rise after being stressed in an electromigration mode. Unlike being stressed in an agglomeration or rupture mode, the silicided polysilicon stressed in the electromigration mode does not demonstrate significant visible changes from a surface view. That is, one cannot detect the fuse being "burned" by examining its appearance through any optical tools. To hide this away from any optical detection is good for security applications as the data stored can not be readily discerned.

To further enhance this optical un-observability, the present disclosure further proposes using at least one metal layer, such as metal 1 layer in normal semiconductor processing, to cover the fuse area so that the electrical fuse element is completely out of sight unless stripping the top layers of a chip that contains such fuse circuit 200. The present disclosure also proposes using the same metal 1 layer or other metal layers above it, such as metal 2 layer, to route interconnects to or from the electrical fuse element 220. Therefore, stripping the top layer(s) in order to reveal the electrical fuse element 220 will inevitably destroy electrical connections to or from the electrical fuse element 220, so that the optically revealed electrical fuse element 220 cannot be studied electrically.

Referring to FIG. 2, suppose the fuse cell 210[0] is selected. During a program operation, the transmission gate 212[0] conducts for connecting the fuse cell 220[0] to a program power supply (VDDQ) while the transmission NMOS transistor 214[0] is off. Meanwhile the switching NMOS transistor 224[0] is also on, then the electrical fuse element 220[0] will be subjected to the stress of the VDDQ, and hence programmed. As a result, the resistance of the electrical fuse element 220[0] will increase by typically about 300 ohms. Complementary to the raised resistance state, when the switching NMOS transistor 224[0] is off, then its electrical fuse element 220[0] will not be subjected to the stress of the VDDQ, and hence its resistance remains at its original low level. During a read operation on the fuse cell 210[0], the transmission NMOS transistor 214[0] conducts for connecting the fuse cell 210[0] to a sense amplifier 206, while the transmission gate 212[0] is off. The sense amplifier 206 translates the resistance level of the electrical fuse element 220[0] to its corresponding HIGH or LOW logic state. If the raised resistance represents the logic HIGH, then the original resistance represents the logic LOW.

Referring to FIG. 2, a column of the transmission gates 212[0:n] and a column of the transmission NMOS transistors 214[0:n] are both controlled by a Y select block 204. A first row of the select transistor 224[0] is controlled by an X select block 202[0]. Similarly, other rows in the select transistors 224[1:n] are controlled by their corresponding X select blocks 202[1:n], respectively. According to the embodiment of the present invention, the programming power supply VDDQ is also supplied to the X and Y select blocks 202[0:n] and 204. During the program operation, the VDDQ supplies current not only to a selected electrical fuse element 220, but also to the X select and Y select blocks 202[0:n] and 204. Therefore, when applying a relatively low voltage by the VDDQ, for instance 300 mV, in trying to read out a resistance of the electrical fuse element 220, a current measured at the VDDQ will not be a current that solely flows through the electrical fuse element 220. It will be instead a combined current flowing through the electrical fuse element 220, X and Y select blocks 202[0:n] and 204. The designs of the X and Y select blocks 202[0:n] and 204 ensure that the portion of the current flowing through the X and Y select blocks 202[0:n] and 204 varies in different process, voltage and temperature conditions to such an extent that it overwhelms the current changes caused by the resistance change in the electrical fuse element 220 due to programming. In other words, the VDDQ is externally accessible only for programming the electrical fuse circuit 200, not for electrically measuring data stored therein. Through adding more components to the current measured at the VDDQ, the present invention makes the electrical fuse element 220 also electrically unobservable to the unintended programming VDDQ channel.

Although FIG. 2 illustrates an electrical fuse circuit 200 with the VDDQ supplies to both the X and Y select blocks 202[0:n] and 204, one having skills in the art would realize that the VDDQ supplying to only one of the peripheral devices, either the X select block 202[0:n] or the Y select block 204, may also serve the purpose of adding current to the fuse element current to make the voltage/current measurement of the fuse resistance impossible. In a broader sense, any peripheral circuit that is active and draws current from the VDDQ during programming operation can be used to confuse attempts to read out the fuse resistance through externally measuring the voltage and current. Here the peripheral circuit is defined as any circuit other than the fuse cells 210[0:n]

itself. The aforementioned X select block 202[0:n] and the Y select block 204 are such peripheral circuits.

Although the switching NMOS transistor 224 is used in the above embodiment of the present invention, one having skills in the art would realize a PMOS transistor or other kind of switching devices may be used instead.

Figure 3:
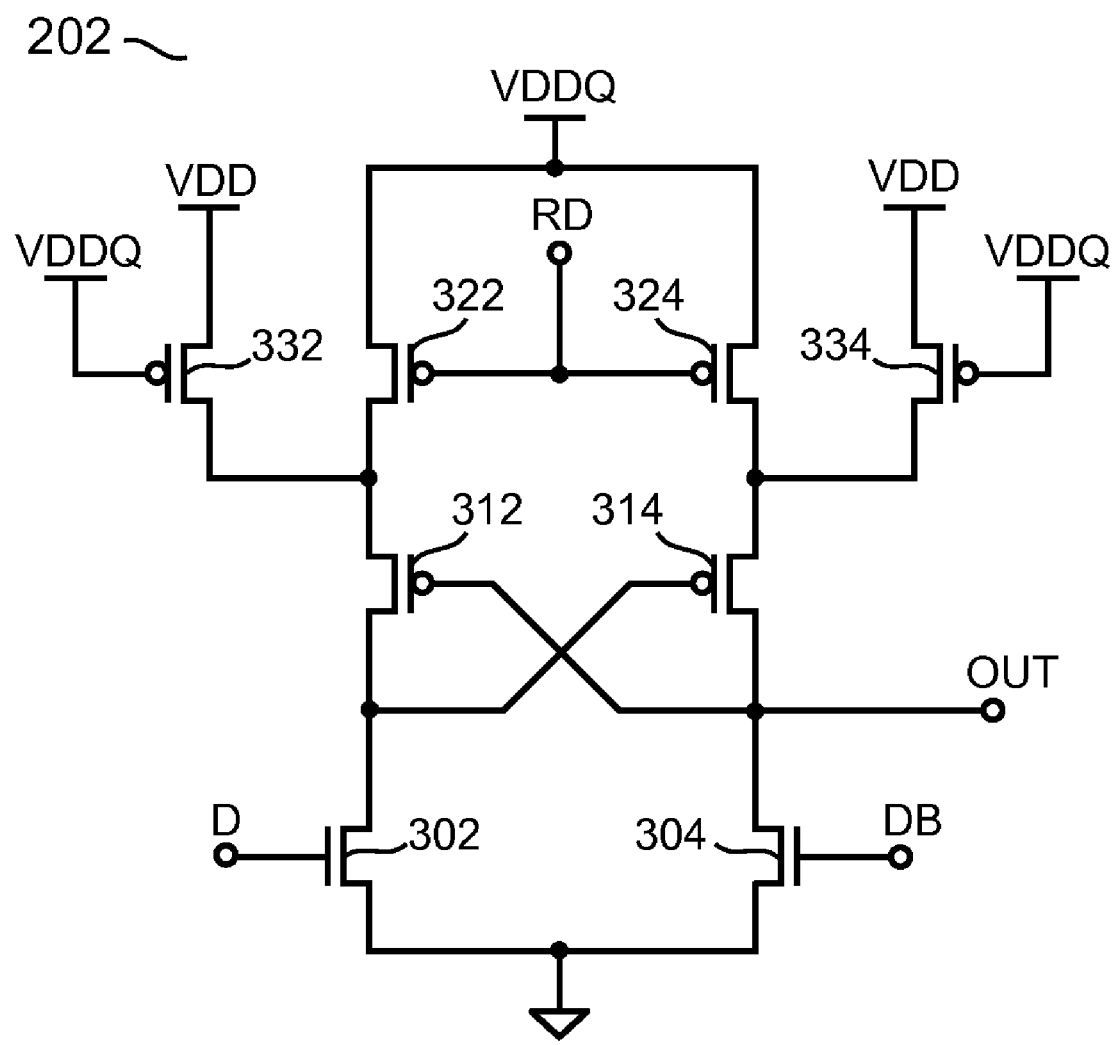
FIG. 3 is a schematic diagram illustrating an implementation of a select circuit according to the embodiment of the present invention.

FIG. 3 is a schematic diagram illustrating an implementation of the X select block 202 according to an embodiment of the present invention. The X select block 202 comprises a pair of NMOS transistors with gates coupled to a pair of complimentary select signals D and DB, respectively. A pair of cross-coupled PMOS transistors 312 and 314 have drains coupled to the drains of the pair of NMOS transistors 302 and 304, respectively. An output node OUT is coupled to the drains of the NMOS transistor 304 and the PMOS transistor 314. When the select signal D is asserted to the logic HIGH, i.e., the select block 202 is selected, the output node OUT will output the logic HIGH. On the other hand, when the select signal D is asserted the logic LOW, i.e., the select block 202 is not selected, the output node OUT will output the logic LOW instead. Sources and drains of PMOS transistors 322 and 324 are coupled between the VDDQ and the PMOS transistors 312 and 314, respectively. Gates of the PMOS transistor 322 and 324 are controlled by a read signal RD. Sources and drains of PMOS transistors 332 and 334 are coupled between a normal power supply VDD and the PMOS transistors 312 and 314. Gates of the PMOS transistors 312 and 314 are controlled by the VDDQ. During a read operation, the read signal RD is asserted, for example, to the logic HIGH voltage which turns off the PMOS transistors 322 and 324, and the VDDQ is de-asserted to a ground voltage (GND) which turns on the PMOS transistors 332 and 334. Therefore, the X select block 202 is powered by the VDD. During a programming operation, the read signal RD is de-asserted to the GND which turn on the PMOS transistors 322 and 324, and the VDDQ is, for example, asserted to the logic HIGH voltage which turns off the PMOS transistors 332 and 334. Then the X select block 202 is powered by the VDDQ. At the same time, the VDDQ is also used to program the electrical fuse element 220. Therefore a current measured at the VDDQ is a combined one from both the X select transistor 202 and the electrical fuse element 220. The resistance of the electrical fuse element 220 cannot be easily extracted by measuring the current.

Note that the VDDQ voltage is determined by the programming need of the electrical fuse element 220, and can be different from the VDD voltage. In this case, the X select block 202 may be viewed as a voltage shifter, which switches the voltage supply to the VDDQ for programming and to the VDD for reading the fuse circuit 100. One having skills in the art would be able to construct a similar circuit as shown in FIG. 3 for the Y select block 204.

Figure 4:
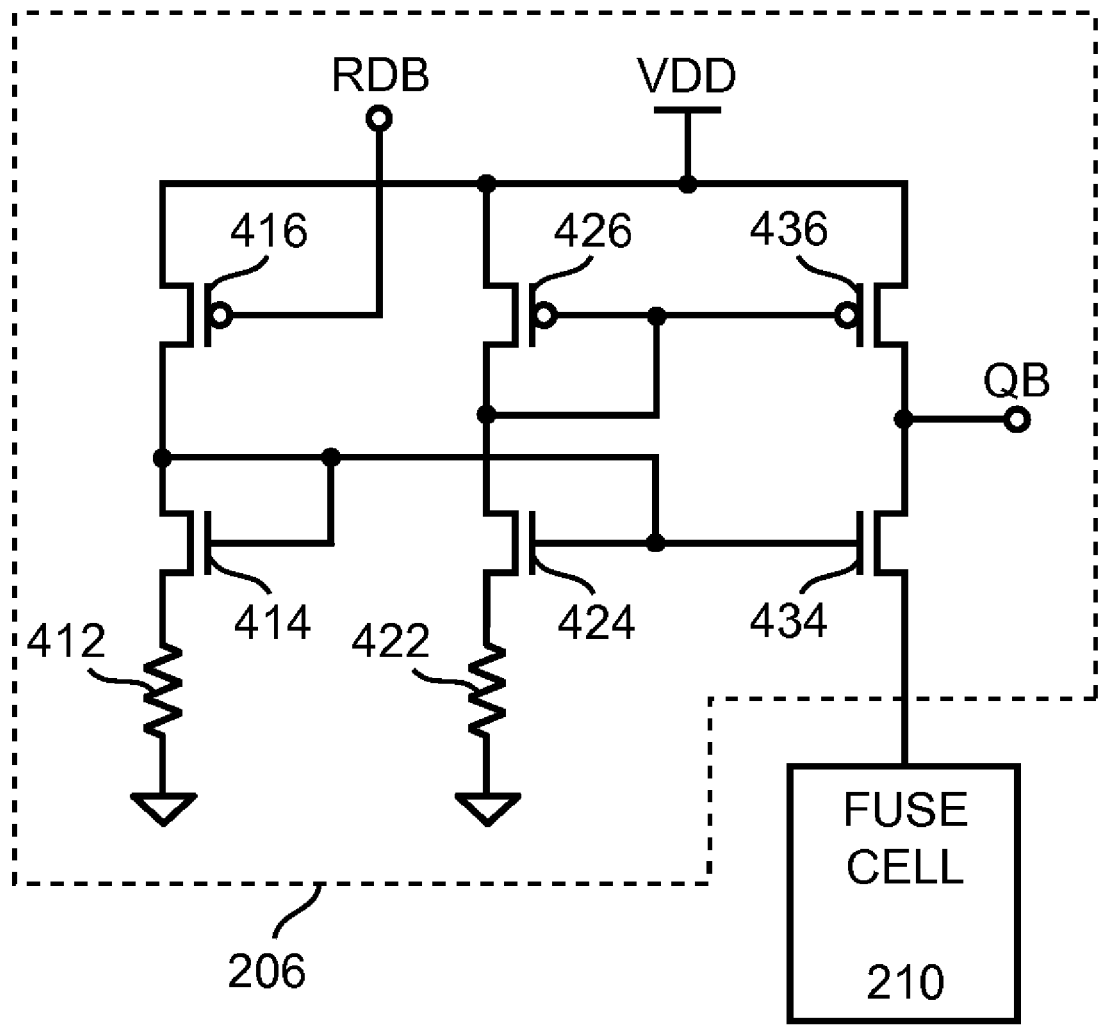
FIG. 4 is a schematic diagram illustrating an implementation of a sense amplifier according to the embodiment of the present invention.

FIG. 4 is a schematic diagram illustrating an implementation of the sense amplifier 206 according to one embodiment of the present invention. The sense amplifier 206 includes a first biasing stage comprising a reference resistor 412, a NMOS transistor 414 and a PMOS transistor 416 connected in series. The gate of the PMOS transistor 416 is controlled by a complementary read signal, RDB. During the read operation, RDB is asserted to the logic LOW voltage, which activates the sense amplifier 206. A biasing voltage at a node A is mirrored to a second biasing stage comprising another reference resistor 422, a NMOS transistor 424 and a PMOS transistor 426 also connected in series. Since the PMOS transistor 426 is connected as a diode, it always operates in the saturation region. A gate of the PMOS transistor 426 is mirrored again to a gate of a PMOS transistor 436, so that the PMOS transistor 436 also operates in the saturation region and serves as a current source for the fuse cell 210 through a NMOS transistor 434. The PMOS transistor 436 and the NMOS transistor 434 serves as an actual amplifying stage for the sense amplifier 206. With the first and second biasing stage, the NMOS transistor diode 414 and the PMOS transistor diode 426 are not in the same voltage divider so that low supply voltage can be applied. The impedance of a PMOS in a saturation region is about 100-200 K ohms comparing with 10-20 K ohms in a linear region. As a result, the sensitivity of the sense amplifier 206 can be improved for sensing small amount of resistance change in the fuse cell 210.

The above paragraphs have described data protective features of the electrical fuse circuit 200. In logic levels, the data programmed inside the electrical fuse circuit 200 may need to be protected from being re-programmed in security applications. The present invention can also provide tamper-resistant features to the electrical fuse circuit 200.

Figure 5:
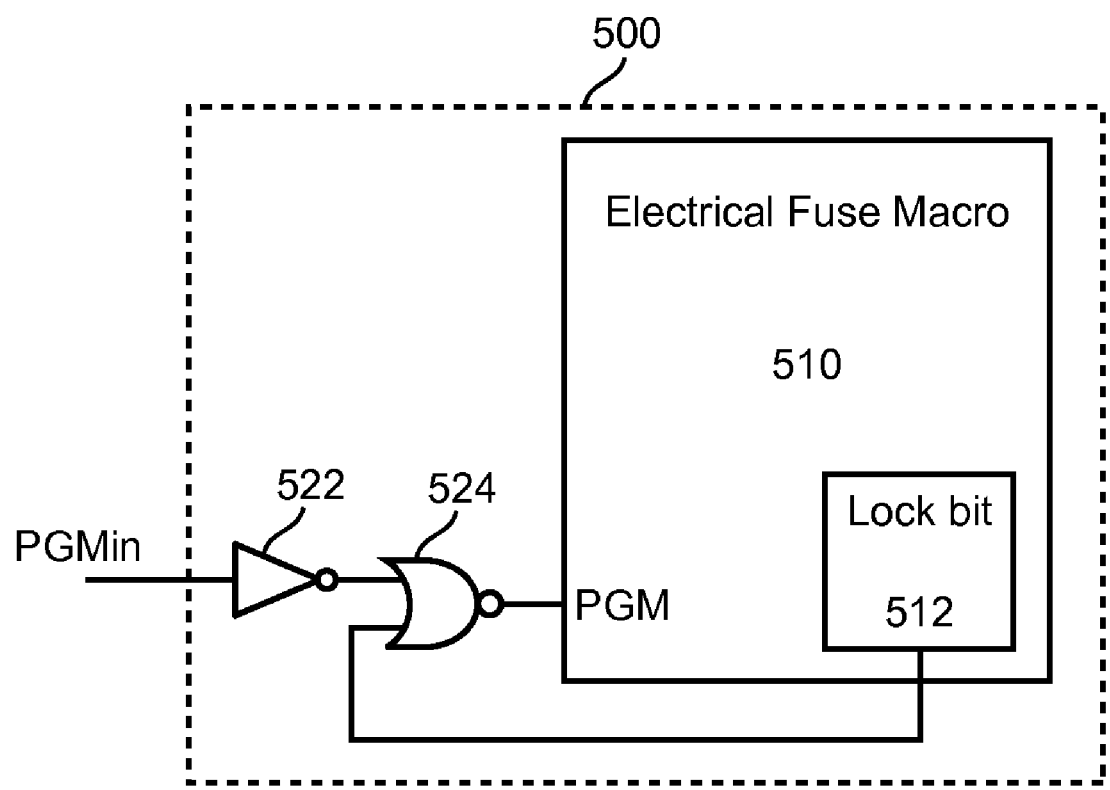
FIG. 5 is a block diagram illustrating a tamper-resistant electrical fuse system according to another embodiment of the present invention.

FIG. 5 is a block diagram illustrating a tamper-resistant electrical fuse system 500 according to another embodiment of the present invention. The electrical fuse system 500 comprises an electrical fuse macro 510 and a lock bit 512. When the lock bit is unprogrammed, the lock bit 512 is read out as the logic LOW, otherwise it is read out as the logic HIGH. An external signal PGMin controls whether or not to program the electrical fuse macro 510. However, if the lock bit 512 is programmed, its output may set an output of a NOR gate 524 to the logic LOW to disable the programming function regardless the state of the external signal PGMin. The lock bit 512 may be implemented as an additional electrical fuse element. It may be an additional storage unit or one of the fuse elements inside of the electrical fuse macro. The data stored in the lock bit 512 can be read out into a latch automatically once the electrical fuse macro 510 is enabled. In this example, an inverter 522 allows the signal PGMin to be logic HIGH assertive. However, one having skills in the art may achieve the same goal using devices other than the inverter 522 and the NOR gate 524.

Figure 6:
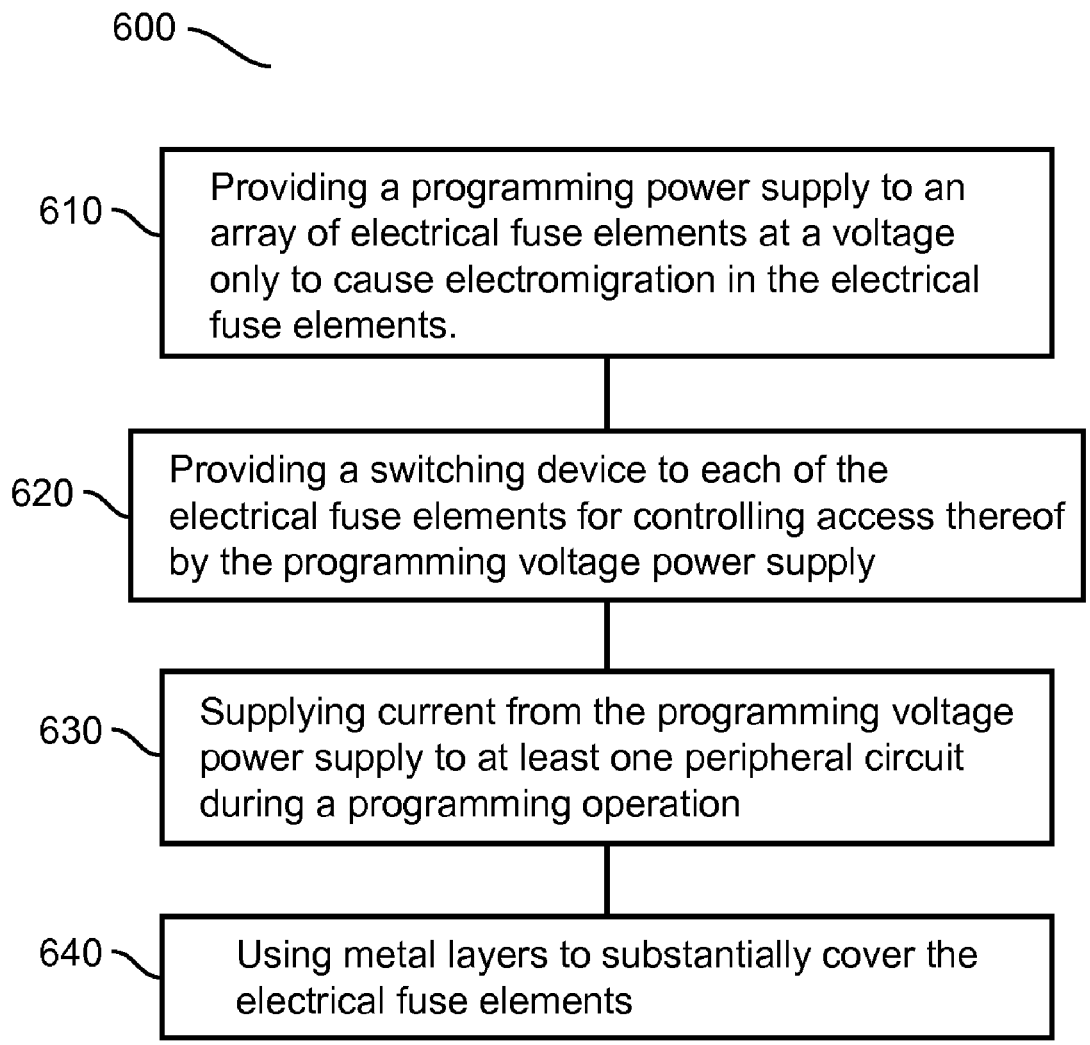
FIG. 6 is a flow chart illustrating steps for programming a secured electrical fuse circuit.

FIG. 6 is a flow chart 600 illustrating steps to prevent unintended read-out of an electrical fuse circuit. In the beginning, step 610 is to provide a programming power supply to an array of electrical fuse elements at a voltage only to cause electromigration in the electrical fuse elements. A switching device to each of the electrical fuse elements is necessary for controlling access thereof by the programming power supply. The switching device is provided in step 620. The same programming power supply is also employed to supply current to at least one peripheral circuit during a programming operation in Step 630. The peripheral circuit may be a select circuit for controlling the switching device. By adding a current component to confuse the current flowing through the electrical fuse elements, aforementioned steps 610 through 630 are for preventing electrical observation of the electrical fuse elements. For hiding the electrical fuse elements from optical observation, step 640 is to use metal layers to substantially cover the electrical fuse elements.

One of the applications of such secured electrical fuse system 500 is to use it to store secured data such as scramble keys. According to a current general practice in data security, encryption/decryption algorithms are made public, while scramble keys are private. A chip manufacturer may provide additional protections by scrambling a first key provided by a user, with a second key provided by the manufacturer. The use of the second key has many advantages. This allows the manufacturer to scramble data easily in different revisions.

The scramble circuit can be constantly updated while the user key stays the same. Different scramble circuits may be applied for different occasions. The scramble circuits may simply be a plurality of XOR gates, linear-feedback-shift-register (LFSR) or ciphers. The second key can be programmed by the manufacturers or system users, while the first key is programmed by the end users. The electrical fuse system 500 can be used for storing the second key.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A fuse circuit comprising:
   at least one electrical fuse element having a resistance level that changes after being stressed in an electromigration mode;
   a switching device serially coupled with the electrical fuse element in a predetermined path between a fuse programming power supply (VDDQ) and a low voltage power supply (GND) for selectively allowing a programming current provided from the VDDQ passing through the electrical fuse element during a fuse programming operation; and
   at least one peripheral circuit coupled to the VDDQ,
   wherein the peripheral circuit is active and draws current in addition to the programming current from the VDDQ during the fuse programming operation such that a current measured at the VDDQ is a combined one from said peripheral circuit and said electrical fuse element.

2. The fuse circuit of claim 1 wherein the electrical fuse element is substantially covered by metal from one or more metal layers which protects the electrical fuse element from any optical inspection without removing the metal.

3. The fuse circuit of claim 2, wherein the electrical fuse element has at least one interconnection made to or from one or more metal layers above the metal covering the fuse element.

4. The fuse circuit of claim 1 further comprising a sense amplifier for detecting the resistance level of the fuse element.

5. The fuse circuit of claim 4, wherein the sense amplifier comprises:
   a first biasing stage with a first reference resistor;
   a second biasing stage with a second reference resistor; and
   an amplifying stage with a PMOS transistor operating in a saturation region for serving current to the electrical fuse element.

6. The fuse circuit of claim 1 further comprising:
   a storage lock bit with its bit flipped once the fuse programming operation is completed; and
   a logic circuit coupled between the storage lock bit and a programming control terminal of the fuse circuit, and configured to protect the fuse circuit from being programmed once the storage lock bit is flipped.

7. The fuse circuit of claim 1, wherein the electrical fuse element is made of silicided polysilicon.

8. The fuse circuit of claim 1, wherein the peripheral circuit is a select circuit coupled to the switching device for turning on or off the switching device according to a predetermined command during a programming operation.

9. A fuse circuit comprising:
   at least one electrical fuse element having a resistance level that changes after being stressed in an electromigration mode;
   one or more metal layers substantially covering the electrical fuse element;
   a switching device serially coupled with the electrical fuse element in a predetermined path between a fuse programming power supply (VDDQ) and a low voltage power supply (GND) for selectively allowing a programming current passing through the electrical fuse element during a programming operation; and
   at least one peripheral circuit coupled to the VDDQ,
   wherein the peripheral circuit is active and draws current from the VDDQ during a fuse programming operation such that a current measured at the VDDQ is a combined one from said peripheral circuit and said electrical fuse element.

10. The fuse circuit of claim 9, wherein the electrical fuse element has at least one interconnection made to or from at least one metal layer above the one or more metal layers covering the fuse element.

11. The fuse circuit of claim 9 further comprising a sense amplifier for detecting the resistance level of the fuse element.

12. The fuse circuit of claim 11, wherein the sense amplifier comprises
   a first biasing stage with a first reference resistor;
   a second biasing stage with a second reference resistor; and
   an amplifying stage with a PMOS transistor operating in a saturation region for serving current to the electrical fuse element.

13. The fuse circuit of claim 9 further comprising:
   a storage lock bit with its bit flipped once the fuse programming operation is completed; and
   a logic circuit coupled between the storage lock bit and a programming control terminal of the fuse circuit, and configured to protect the fuse circuit from being programmed once the storage lock bit is flipped.

14. The fuse circuit of claim 9, wherein the electrical fuse element is made of silicided polysilicon.

15. The fuse circuit of claim 9, wherein the peripheral circuit is a select circuit coupled to the switching device for turning on or off the switching device according to a predetermined command during a programming operation.

* * * * *